(12) United States Patent
Hu et al.

(10) Patent No.: US 6,737,294 B1
(45) Date of Patent: May 18, 2004

(54) METHOD OF REDUCING SURFACE LEAKAGE CURRENTS OF A THIN-FILM TRANSISTOR SUBSTRATE

(75) Inventors: Chin-Wei Hu, Hsin-Chu Hsien (TW); Kun-Hong Chen, Taipei Hsien (TW)

(73) Assignee: Au Optronics Corp., Hsin-Chu (TW)

( * ) Notice: Subject to any disclaimer, the term of this patent is extended or adjusted under 35 U.S.C. 154(b) by 0 days.

(21) Appl. No.: 10/463,677

(22) Filed: Jun. 18, 2003

(30) Foreign Application Priority Data

Apr. 4, 2003 (TW) .......................... 92107813 A

(51) Int. Cl.$^7$ .................. H01L 21/00; H01L 21/20; H01L 21/3205; H01L 21/31
(52) U.S. Cl. .................. 438/99; 438/82; 438/149; 438/151; 438/164; 438/479; 438/587; 438/778; 438/780
(58) Field of Search .................. 438/82, 99, 149, 438/151, 164, 479, 587, 778, 780

(56) References Cited

U.S. PATENT DOCUMENTS 5,408,345 A  *  4/1995 Mitsui et al. .................. 349/42
6,337,222 B1 *  1/2002 Shimoda et al. .............. 438/29
6,475,836 B1 * 11/2002 Suzawa et al. ............. 438/149
6,599,785 B2 *  7/2003 Hamada et al. ............. 438/151
6,599,818 B2 *  7/2003 Dairiki ........................ 438/486
6,613,620 B2 *  9/2003 Fujimoto et al. ........... 438/166

* cited by examiner

Primary Examiner—Nathan J. Flynn
Assistant Examiner—Stanetta Isaac
(74) Attorney, Agent, or Firm—Winston Hsu

(57) ABSTRACT

A plurality of thin-film transistors are formed on a substrate. An insulating layer and a metal layer are formed on the substrate, the metal layer including a source electrode and a drain electrode connecting to each of the transistors, and a channel region defined between the source electrode and the drain electrode. An organic layer is formed to cover the metal layer and the insulating layer. A transparent conductive layer is formed on the organic layer. Therein the insulating layer is simultaneously solidified when forming the organic layer, thus reducing surface leakage currents of the substrate.

8 Claims, 7 Drawing Sheets

METHOD OF REDUCING SURFACE LEAKAGE CURRENTS OF A THIN-FILM TRANSISTOR SUBSTRATE

BACKGROUND OF INVENTION

1. Field of the Invention

The present invention relates to a method of reducing surface leakage currents of a thin-film transistor substrate, and more particularly, to a method of reducing surface leakage currents of a thin-film transistor substrate of a liquid crystal display.

2. Description of the Prior Art

A liquid crystal display panel comprises a thin-film transistor (TFT) substrate, a color filter (CF) substrate, and a liquid crystal layer positioned between the TFT substrate and the CF substrate. The TFT substrate contains a plurality of matrix pixels, which consist of a plurality of data lines and a plurality of scan lines, and a plurality of pixel driving circuits consisting of a plurality of electric components, such as thin-film transistors and capacitors. The pixel driving circuits are positioned on the intersections of each data line and each scan line. To control the operation of each pixel, an image data signal is transmitted from the data line to a drain electrode and a transparent pixel electrode within the pixel, and a switching/addressing signal is transmitted from the scan line to a gate electrode within the pixel.

Please refer to FIG. 1 of a cross-sectional diagram of a thin-film transistor substrate according to the prior art. As shown in FIG. 1, a semiconductor layer 12 is formed on a surface of a thin-film transistor substrate 10. A plurality of p-type doping regions 14 and n-type doping regions 16 are formed in the semiconductor layer 12, functioning as sources or drains of thin-film transistors and to define the thin-film transistors as n-type thin-film transistors or p-type thin-film transistors. Following that, a gate insulating layer 18 and a first metal layer 20 are formed on the semiconductor layer 12, respectively. A portion of the first metal layer 20 is removed using a photolithographic process and an etching process, so as to form a plurality of gates 20 on the semiconductor layer 12.

A thick oxide layer 22 is then formed on the substrate 10, functioning as an inter layer dielectric (ILD) between the gates 20 and other conductive materials. A second metal layer is formed on the oxide layer 22. A photolithographic process and an etching process are used to remove portions of the second metal layer, so as to define a source/drain electrode 24 connecting to either of the source 14 and the drain 14, a source/drain electrode 26 connecting to either of the source 16 and the drain 16, and a channel region 28 positioned above each gate 20. Following that, a silicon nitride (SiNx) layer 30 of approximately 3000 angstroms thick is formed on the substrate 10, functioning as a passivation layer. A transparent conductive layer 32, such as indium tin oxide (ITO), is formed to connect to the transistors and functions as a pixel electrode, thus completing the fabrication of the substrate 10.

The silicon nitride layer is usually used in a typical ultra high aperture (UHA) process to cover the transistors. In addition, a contact hole is also used in the UHA process to connect the transparent conductive layer and the drain electrode, so as to increase the area of the transparent conductive layer and the aperture of the substrate. However, the silicon nitride layer has a high dielectric constant and brings high parasitical capacitance to result in abnormal images. In addition, the thickness of the silicon nitride layer is usually limited to less than 5000 angstroms. Therefore, the silicon nitride layer provides poor effects to against moisture and impurity intrusion to the devices and results in surface leakage currents to affect the electrical performances of the devices.

SUMMARY OF INVENTION

It is therefore an objective of the claimed invention to provide a method of forming a thin-film transistor substrate to reduce parasitical capacitance and surface leakage currents of the thin-film transistor substrate.

According to the claimed invention, a plurality of thin-film transistors are formed on a substrate. An insulating layer and a metal layer are formed on the substrate, the metal layer including a source electrode and a drain electrode connecting to each of the transistors, and a channel region defined between the source electrode and the drain electrode. An organic layer is formed to cover the metal layer and the insulating layer. A transparent conductive layer is formed on the organic layer.

It is an advantage of the present invention that portions of the insulating layer positioned between the source electrode and the drain electrode is simultaneously solidified when forming the organic layer. In addition, the moisture is taken out of the insulating layer and the structure of the insulating layer is also repaired during the fabrication process of the organic layer. As a result, the leakage paths of the transistors are prevented and the surface leakage currents of the substrate are thus reduced. Since the organic layer has a lower dielectric constant than the silicon nitride layer used in the prior art, the thickness of the organic layer can be increased according to the present invention. Therefore, the parasitical capacitance between the transparent conductive layer and the drain electrode can be reduced, and the electrical performances of the transistors can also be improved.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
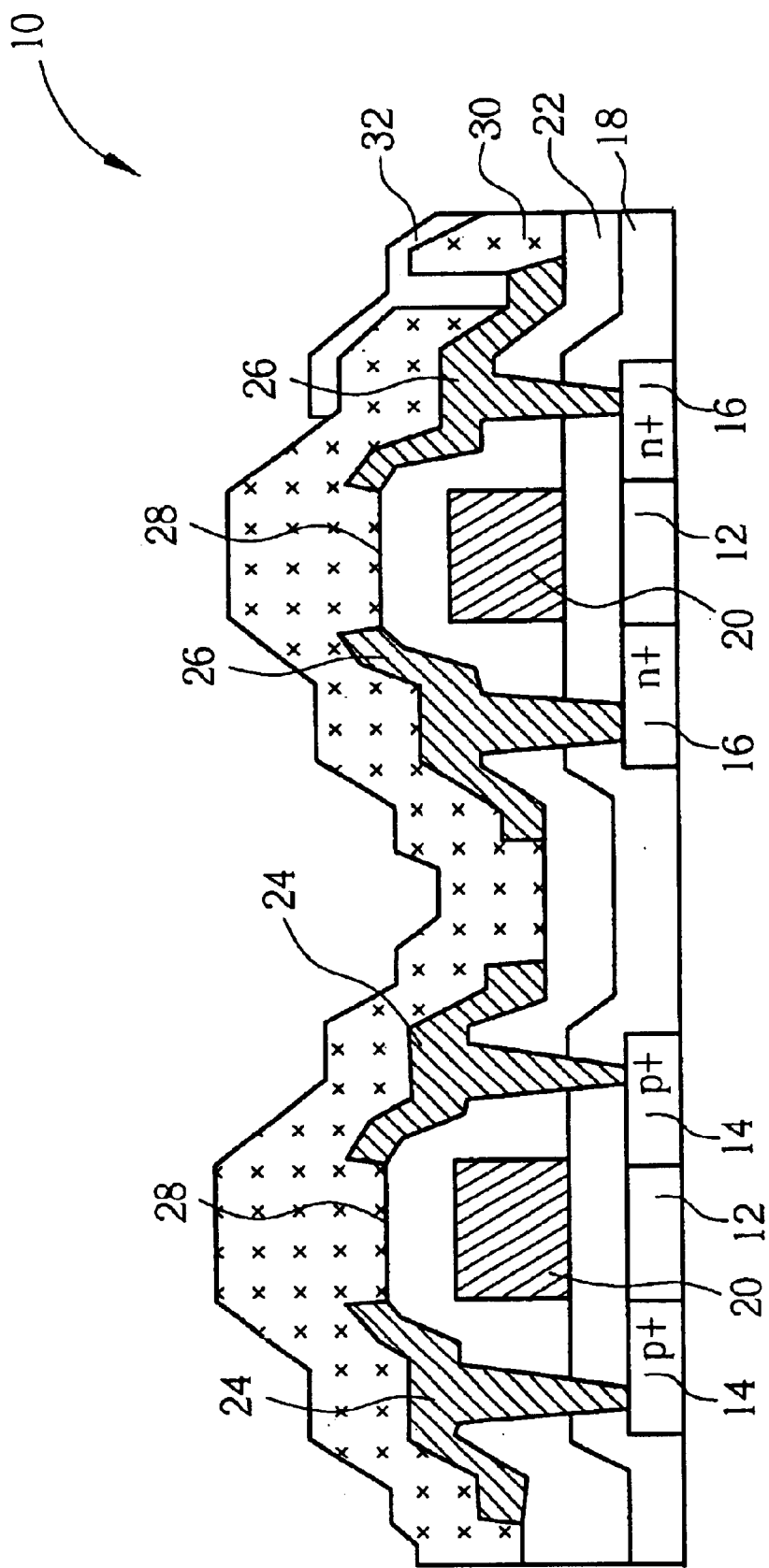
FIG. 1 is a cross-sectional diagram of a thin-film transistor substrate according to the prior art.
Figure 2:
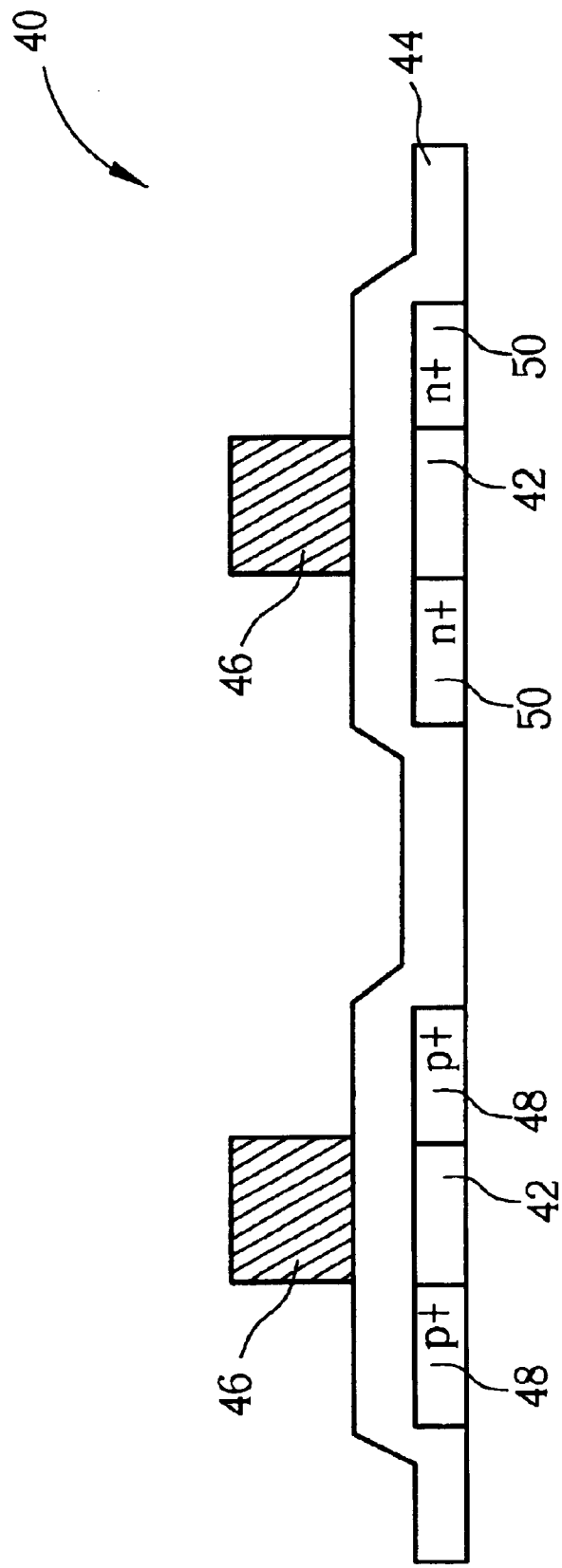
FIG. 2 to FIG. 5 are schematic diagrams of a method of forming a thin-film transistor substrate according to the present invention.

Please refer to FIG. 2 to FIG. 5. FIG. 2 to FIG. 5 are schematic diagrams of a method of forming a thin-film transistor substrate according to the present invention. As shown in FIG. 2, a semiconductor layer 42 is formed on a surface of a thin-film transistor substrate 40. Different types of dopants, such as p-type dopants and n-type dopants, are used to form a plurality of p-type doping regions 48 and n-type doping regions 50 in the semiconductor layer 42, functioning as sources/drains of thin-film transistors and defining the thin-film transistors as n-type thin-film transistors or p-type thin-film transistors. Following that, a gate insulating layer 44 and a first metal layer 46 are formed on the semiconductor layer 42, respectively. A portion of the first metal layer 46 is removed using a photolithographic process and an etching process, so as to form a plurality of gates 46 on the semiconductor layer 42. Alternatively, in other embodiments of the present invention, the gates 46 can be formed prior to the fabrication of the sources/drains 48 and 50. In this case, after forming the gates 46 on the semiconductor layer 42, an ion implantation process is performed using the gates 46 as implantation masks, thus forming a plurality of self-aligned doping regions in the semiconductor layer 42 as the sources/drains 48 and 50 of the transistors.

Figure 3:
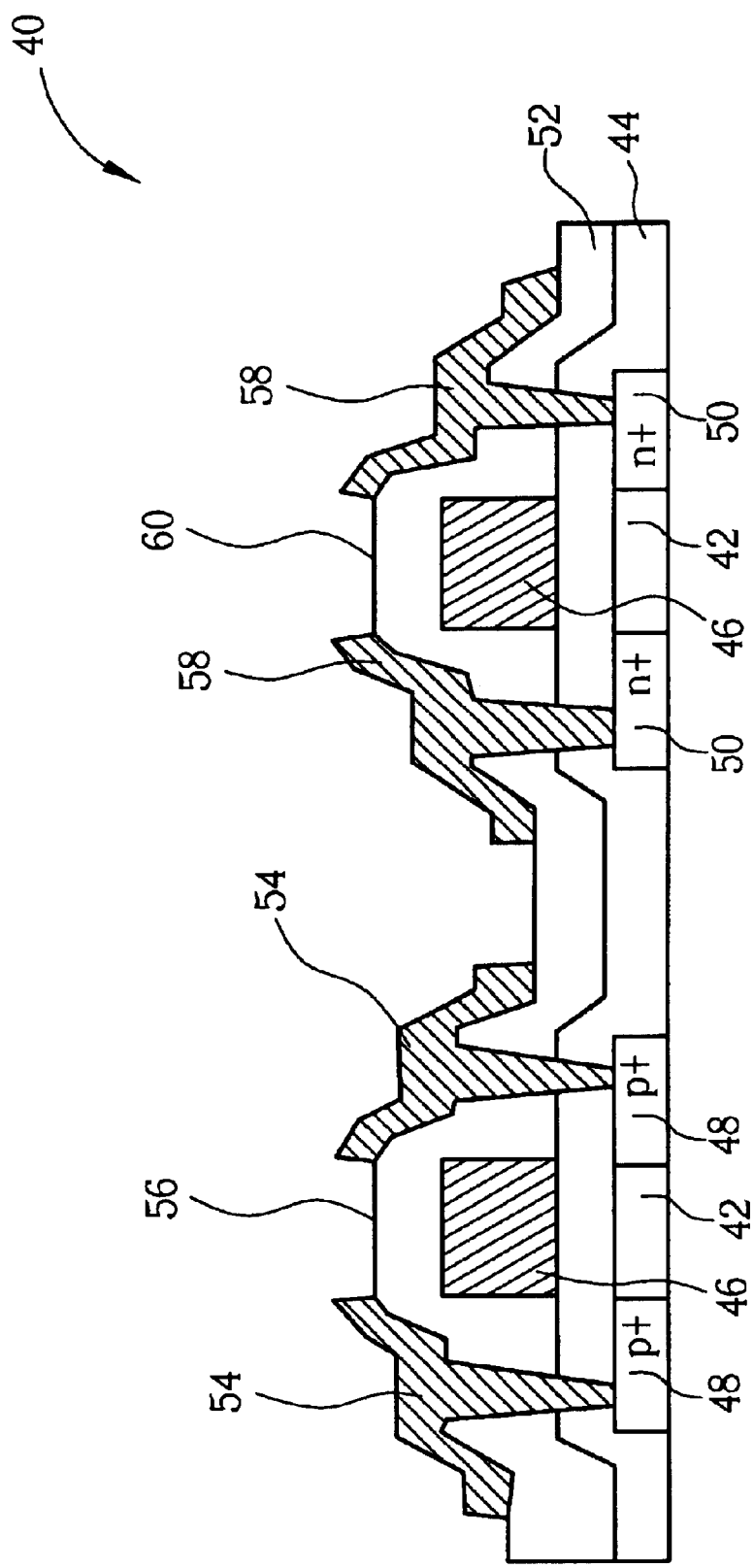

As shown in FIG. 3, a thick oxide layer 52 is then formed on the substrate 40, functioning as an inter layer dielectric (ILD) between the gates 46 and other conductive materials. A second metal layer is formed on the oxide layer 52. A photolithographic process and an etching process are used to remove portions of the second metal layer, so as to define a source/drain electrode 54 connecting to either of the source 48 and the drain 48, a source/drain electrode 58 connecting to either of the source 50 and the drain 50. A channel region 56 is defined between the source electrode 54 and the drain electrode 54. A channel region 60 is defined between the source electrode 58 and the drain electrode 58.

Figure 4:
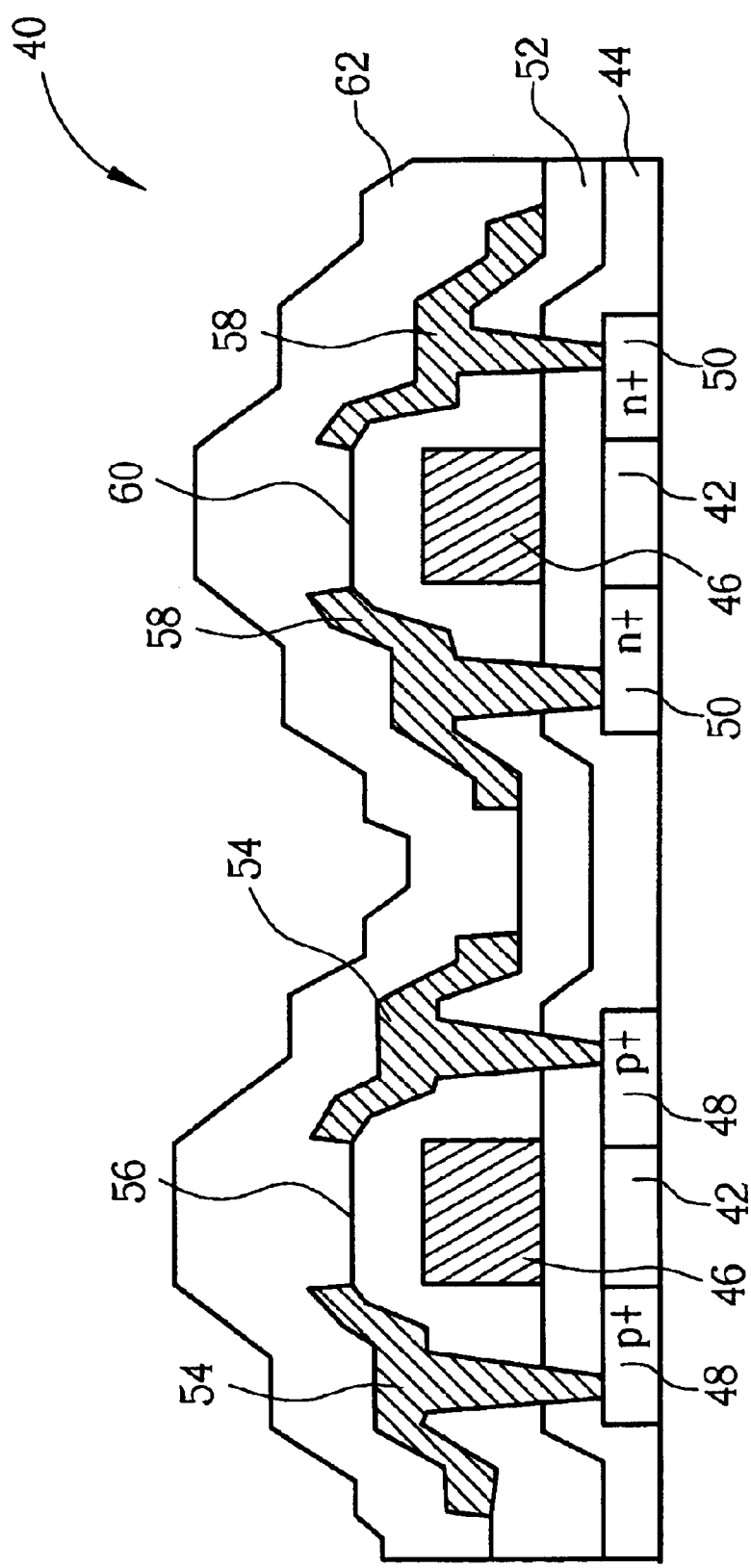
Figure 5:
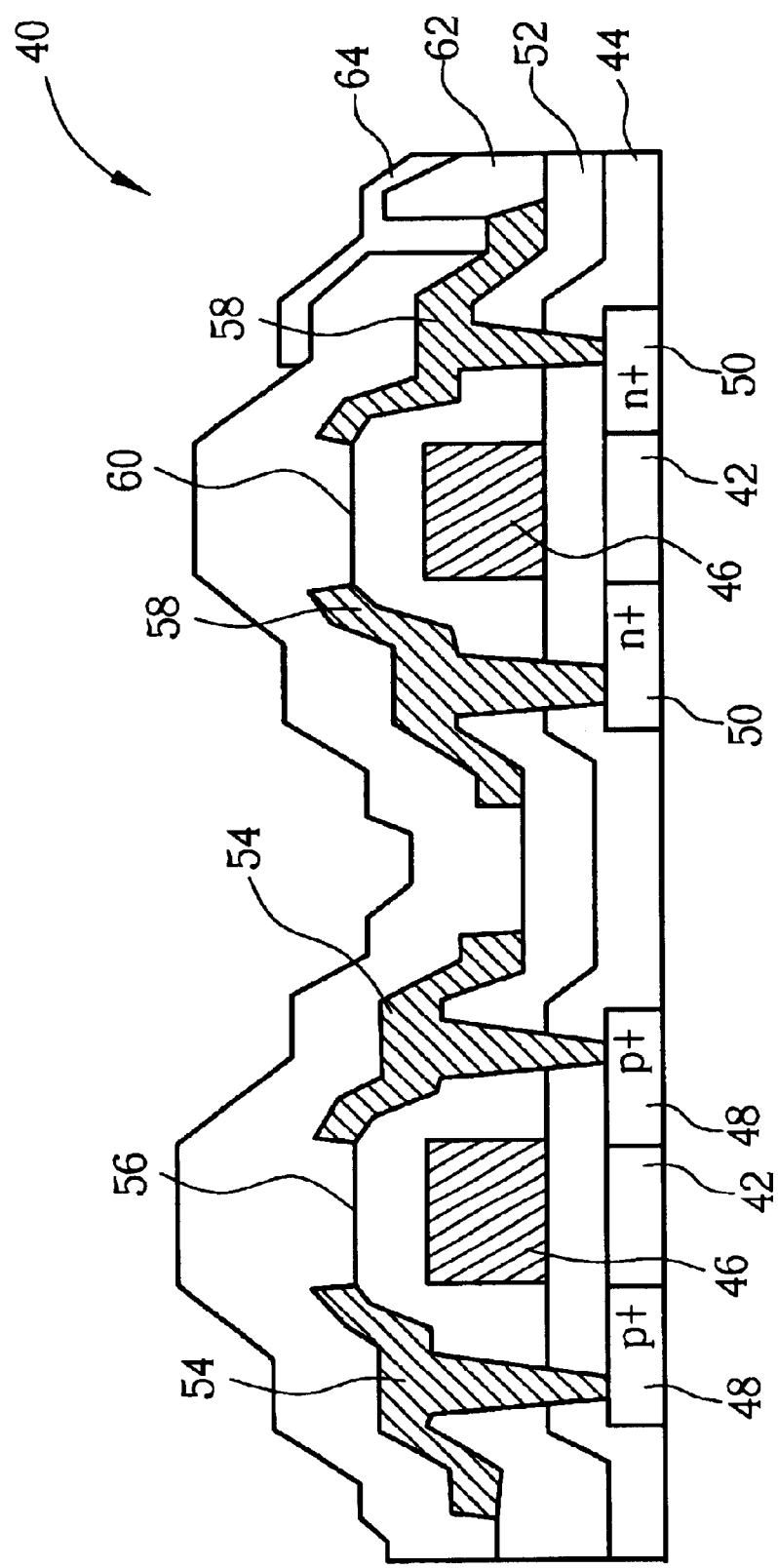

As shown in FIG. 4, an organic layer 62, such as resin, is coated on the substrate 40. The organic layer 62 is treated with a transparent treatment and a solidification heat treatment, so that it can be transparent and solidified to provide high transparency and good insulation ability. During the transparent treatment and the solidification heat treatment, the moisture of the oxide layer 52 positioned between the source electrode 54 and the drain electrode 54 and positioned between the source electrode 58 and the drain electrode 58 can also be taken out and the structure of the oxide layer 52 can be simultaneously solidified. Therefore, leakage paths from the source electrodes and the drain electrodes 54 and 58 and from the gates 46 are completely prevented and the leakage currents of the substrate 40 can be effectively reduced. Finally, as shown in FIG. 5, a transparent conductive layer 64, such as indium tin oxide (ITO), is formed to connect to the transistors and functions as a pixel electrode, thus completing the fabrication of the substrate 40.

Since the organic layer 62 has a lower dielectric constant than that of the silicon nitride layer (normally the dielectric constant of silicon nitride ranges between 6 and 9), and the organic layer is treated with the transparent treatment, a thickness of the organic layer is suggested to between twenty thousand angstroms and thirty thousand angstroms in a better embodiment of the present invention. With this thickness, the substrate 40 may have an approximately planar surface, thus preventing damages to some device elements on the substrate 40 when pressing and combining the substrate 40 onto another substrate of the liquid crystal display. In addition, the aperture of the liquid crystal display can also be increased with the transparent organic layer. Normally, the parasitical capacitance between the source/drain electrode 58 and the transparent conductive layer 64 is inversely proportional to the thickness of the dielectric layer between the source/drain electrode 58 and the transparent conductive layer 64. Therefore, with the increase in the thickness of the organic layer 62, the parasitical capacitance between the source/drain electrode 58 and the transparent conductive layer 64 can be effectively reduced. As a result, RC delay effects can be prevented and the response speeds of the liquid crystal display can thus be improved.

Figure 6:
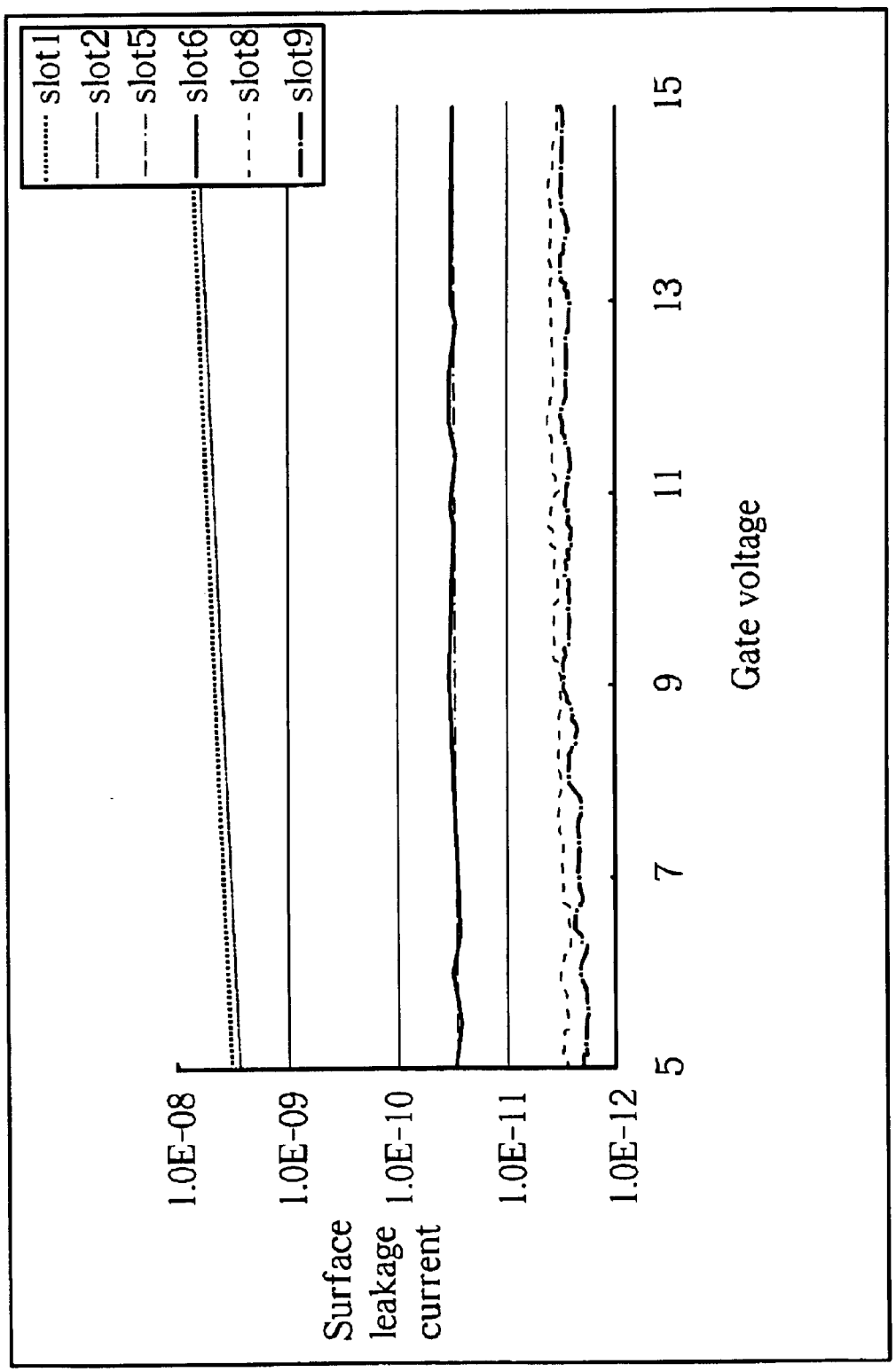
FIG. 6 and FIG. 7 are schematic diagrams for comparing leakage currents of thin-film transistor substrates between the prior art and the present invention.
Figure 7:
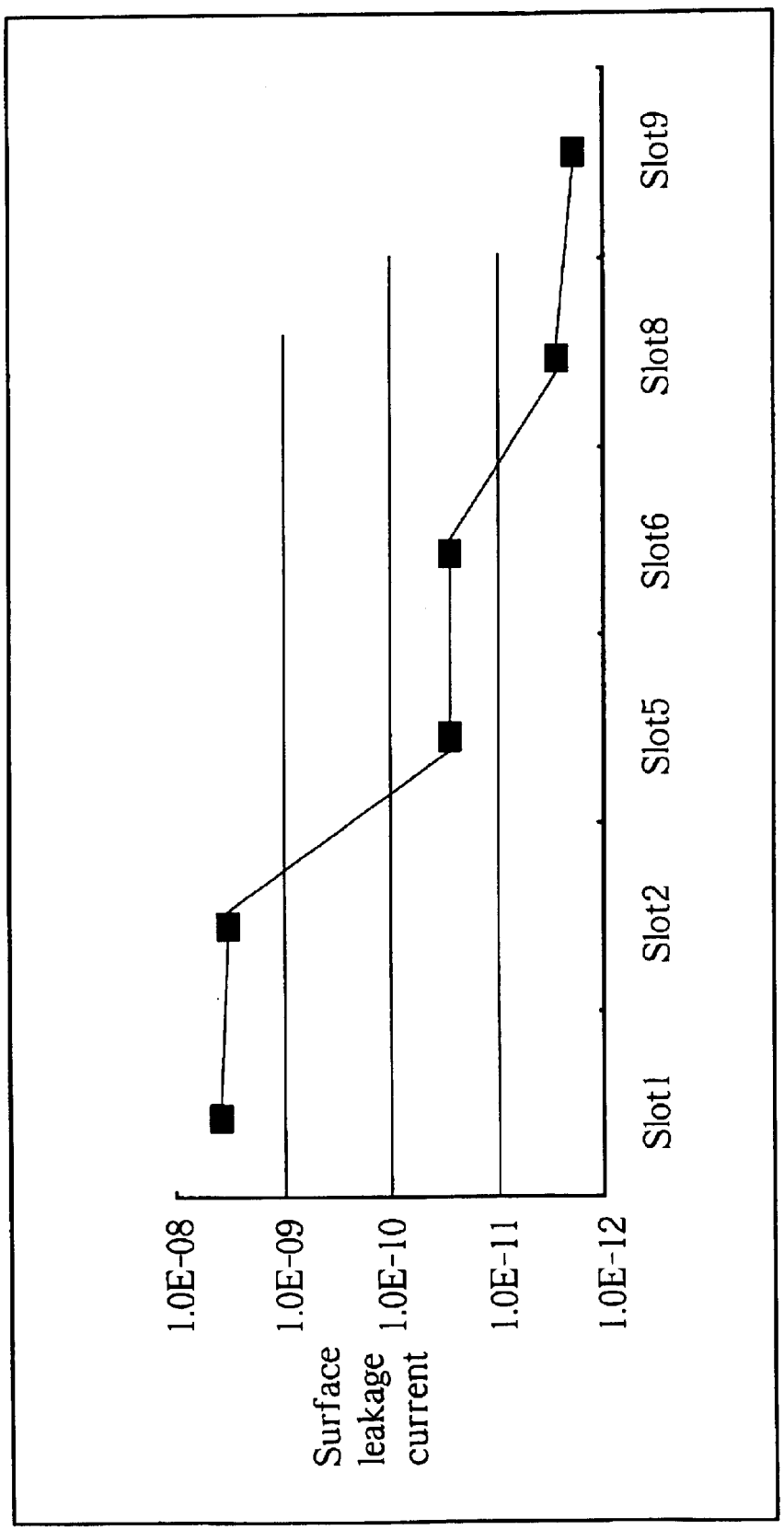

Please refer to FIG. 6 and FIG. 7 of schematic diagrams for comparing leakage currents of thin-film transistor substrates between the prior art and the present invention. The data of slot1 and slot2 refer to the leakage currents measured on the source/drain electrode after patterning the source/drain electrode on the thin-film transistor substrate. The data of slot5 and slot6 refer to the leakage currents measured on the source/drain electrode after forming the silicon nitride layer on the thin-film transistor substrate according to the prior art. The data of slot8 and slot9 refer to the leakage currents measured on the source/drain electrode after forming the organic layer on the thin-film transistor substrate according to the present invention. An operation voltage supplied on the gate is suggested to between 5 and 15 voltages. As shown in FIG. 6 and FIG. 7, when neither the silicon nitride layer nor the organic layer covers on the source/drain electrode, such as the conditions of slot1 and slot2, the measured leakage currents are between $10^{-8}$ and $10^{-9}$. When the silicon nitride layer covers on the source/drain electrode, such as the conditions of slot5 and slot6, the measured leakage currents are between $10^{-10}$ and $10^{-11}$. When the organic layer covers on the source/drain electrode, such as the conditions of slot8 and slot9, the measured leakage currents are between $10^{-11}$ and $10^{-12}$. Therefore, it is obvious that the leakage paths of the oxide layer can be effectively prevented and the power of the leakage currents can be reduced approximately an order of magnitude when using the organic layer of the present invention to replace the silicon nitride layer of the prior art.

In contrast to the prior art, the method of the present invention removes the process of forming the silicon nitride layer and uses the transparent organic layer to increase the aperture of the liquid crystal display. In addition, a portion of the insulating layer positioned between the source electrode and the drain electrode is simultaneously solidified when forming the organic layer, thus taking the moisture out of the insulating layer and repairing the structure of the insulating layer to prevent the leakage paths of the transistors and reduce surface leakage currents of the substrate. Since the organic layer has a lower dielectric constant than the silicon nitride layer used in the prior art, the thickness of the organic layer can be increased according to the present invention. Therefore, the parasitical capacitance between the transparent conductive layer and the drain electrode can be reduced, and the electrical performances of the transistors can also be improved.

Those skilled in the art will readily observe that numerous modifications and alterations of the method may be made while retaining the teachings of the invention. Accordingly, the above disclosure should be construed as limited only by the metes and bounds of the appended claims.

What is claimed is:

1. A method of reducing surface leakage currents of a thin-film transistor substrate, the method comprising:
   forming a plurality of thin-film transistors on a substrate;
   forming an insulating layer and a metal layer on the substrate, the metal layer comprising a source electrode and a drain electrode connecting to each of the transistors, and a channel region defined between the source electrode and the drain electrode;
   forming an organic layer to cover the metal layer and the insulating layer; and
   forming a transparent conductive layer on the organic layer.

2. The method of claim 1 wherein when forming the organic layer, the insulating layer is simultaneously solidified to reduce the surface leakage currents of the substrate.

3. The method of claim 1 further comprising a transparent treatment and a solidification heat treatment on the organic layer when forming the organic layer.

4. The method of claim 3 wherein the transparent treatment and the solidification heat treatment are capable of taking the moisture out of the insulating layer, so as to prevent leakage paths of the transistors.

5. The method of claim 3 wherein the transparent treatment and the solidification heat treatment are capable of repairing the structure of the insulating layer, so as to prevent leakage paths of the transistors.

6. The method of claim 1 wherein a thickness of the organic layer ranges approximately between twenty thousand angstroms and thirty thousand angstroms.

7. The method of claim 1 wherein the organic layer comprises resin.

8. The method of claim 1 wherein the insulating layer comprises an oxide layer.

* * * * *